United States Patent
Viviani et al.

(10) Patent No.: US 10,847,112 B1
(45) Date of Patent: *Nov. 24, 2020

(54) VCOM WITH REDUCED SUPPLY RAILS

(71) Applicant: IML International, Grand Cayman (KY)

(72) Inventors: Alberto Giovanni Viviani, Mountain View, CA (US); Dimitry Goder, San Jose, CA (US); JunGi Lee, Seoul (KR); ChinFa Kao, Taipei (TW); Chun Lu, San Jose, CA (US)

(73) Assignee: IML International, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 15/417,139

(22) Filed: Jan. 26, 2017

Related U.S. Application Data

(63) Continuation of application No. 14/252,721, filed on Apr. 14, 2014, now Pat. No. 9,558,707.

(60) Provisional application No. 61/811,648, filed on Apr. 12, 2013.

(51) Int. Cl.
*G09G 3/36* (2006.01)
*H03K 4/48* (2006.01)

(52) U.S. Cl.
CPC .......... *G09G 3/3696* (2013.01); *H03K 4/48* (2013.01); *G09G 2310/06* (2013.01); *G09G 2310/08* (2013.01); *G09G 2320/0247* (2013.01)

(58) Field of Classification Search
CPC .......................... G09G 3/3655; G09G 3/3696
See application file for complete search history.

(56) References Cited

U.S. PATENT DOCUMENTS

| | | | |
|---|---|---|---|
| 5,654,728 A | 8/1997 | Kanazawa | |
| 8,044,911 B2 | 10/2011 | Chung | |
| 2008/0062027 A1* | 3/2008 | Chung | G09G 3/3655 341/155 |
| 2008/0316154 A1* | 12/2008 | Kim | G09G 3/3655 345/87 |
| 2009/0219270 A1* | 9/2009 | Penev | G09G 3/3688 345/211 |

* cited by examiner

*Primary Examiner* — Alexander Eisen
*Assistant Examiner* — Cory A Almeida
(74) *Attorney, Agent, or Firm* — Aka Chan LLP

(57) ABSTRACT

A VCOM generator circuit generates a VCOM signal for an electronic display. The VCOM circuit includes an operational amplifier having reduced supply rails. In an implementation, the VCOM circuit has at least three supply rails, AVDD, ground or GND, and VP or VN, or both. VP is less than AVDD and greater than VN. VN is higher than ground and below VP. The VCOM circuit with reduced voltage supply rails for VP and VN reduces power consumption of the VCOM op amps. By reducing power consumption, this also reduces the surface temperature of the integrated circuit.

21 Claims, 8 Drawing Sheets

VCOM WITH REDUCED SUPPLY RAILS

CROSS-REFERENCE TO RELATED APPLICATIONS

This patent application is a continuation of U.S. patent application Ser. No. 14/252,721, filed Apr. 14, 2014, issued as U.S. Pat. No. 9,558,707 on Jan. 31, 2017, which claims the benefit of U.S. patent application 61/811,648, filed Apr. 12, 2013. These applications are incorporated by reference along with all other references cited in this application.

BACKGROUND OF THE INVENTION

The invention is related to the field of electrical circuits and more specifically to driver circuitry for display panel products.

Electronic visual displays are used in a wide range of applications including computer monitors, televisions, instrument panels, aircraft cockpit displays, and signage. They are common in consumer devices such as laptop computers, video players, music players, gaming devices, clocks, watches, calculators, telephones, smartphones, tablets, and many other devices.

Some examples of display panel technologies include liquid crystal displays (LCDs), organic led emitting diode (OLED) displays, and plasma displays. Such displays operate according to various principles. For example, LCDs use the light modulating properties of liquid crystals to produce images. Since LCDs do not emit light, there is often a backlight behind the LCD panel to illuminate the display. Other display technologies work according to different principles.

Electronics are used to drive an electronic display. These electronics provide power and electrical input. For example, there are voltages for the row and column drivers to drive a thin-film transistor (TFT) LCD. Electronics generate voltage waveforms to achieve (1) color output stability to alleviate flickering and inconsistent color, and (2) liquid crystal stability to prevent display damage due to localized net voltage build-up.

Further, a LCD display panel has a VCOM input. VCOM is adjusted to match the capacitance and performance specifications of the TFT panel to maximize contrast and minimize flickering. The VCOM can be a programmable function, which can be used to adjust a panel to maximize contrast, minimize flickering during operation, and optimize panel performance.

It is desirable to improve electronics used to drive electronic visual displays, so that these displays and the electronics used to drive them to improve performance, reduce cost, and reduce power consumption. Therefore, improved electronics and circuits are needed.

BRIEF SUMMARY OF THE INVENTION

A VCOM generator circuit generates a VCOM signal for an electronic display. The VCOM circuit includes an operational amplifier having reduced supply rails. In an implementation, the VCOM circuit has at least three supply rails, AVDD, ground or GND, and VP or VN, or both VP and VN. VP is less than AVDD and greater than VN. VN is higher than ground and below VP. The VCOM circuit with reduced voltage supply rails for VP and VN reduces power consumption of the VCOM op amps. By reducing power consumption, this also reduces the surface temperature of the integrated circuit.

In a first implementation, a technique to reduce the VCOM power consumption is to use different supply levels. A lower supply voltage of the VCOM amplifier can be set to a potential above ground (for example, connected to an available supply rail of VCORE, which is commonly about 1.2 volts) instead of ground. In an implementation, VCORE is generated by an on-board buck controller. The voltage supply rail of the VCOM amplifier can be connected to a voltage lower than AVDD, instead of AVDD. For example, it is possible to use VIN voltage, which is commonly below the AVDD level.

This technique can reduce the power consumption by a factor Psaving=1−(VCORE−VIN)/(AVDD−GND). Typical values of Psaving can be 66 percent for notebooks and tablets, and 50 percent for televisions.

In a second implementation, a technique to reduce the VCOM power consumption is to use four supply rails for the op amp. In addition to AVDD and GND, a VN is also used. The VN voltage is set above ground, for example to about 1.2 volts, which is often a commonly available supply rail (VCORE). In an implementation, Vcore is generated by an on-board buck controller. Another additional supply voltage VP or other high supply (sourcing) voltage is connected to the op amp, where VP is less than AVDD. It is possible to use VIN for this power rail as VIN is also typically lower than AVDD. The supply to use (AVDD or VP, or GND or VN) is selected by the op amp based on the needs of the output.

This technique can reduce the power consumption by a factor Psaving=1−(VCORE−VIN)/(AVDD−GND)*Dlow+(1−Dlow)), where Dlow is the duration of the use of the "low" supplies with respect to the total period of the signal. Typical values of Psaving can be 50 percent for notebooks and tablets, and 40 percent for televisions.

Another implementation can use only three power rails presenting a combination of first and second implementations. For example, it is possible to use AVDD, GND, and VN voltage (without the VP power supply) or AVDD, GND, and VP voltage (without the VN power supply). The power savings for this implementation will be somewhere between the first and the second implementations.

The first implementation provides greater power savings than the second implementation, but has a limitation in the system output swing. The output swing is limited to VIN on the high side and to VCORE or VN on the low side. The second implementation provides reasonable power savings with no limitations on the system output voltage. The third implementation offers a compromise between the first and the second implementations.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
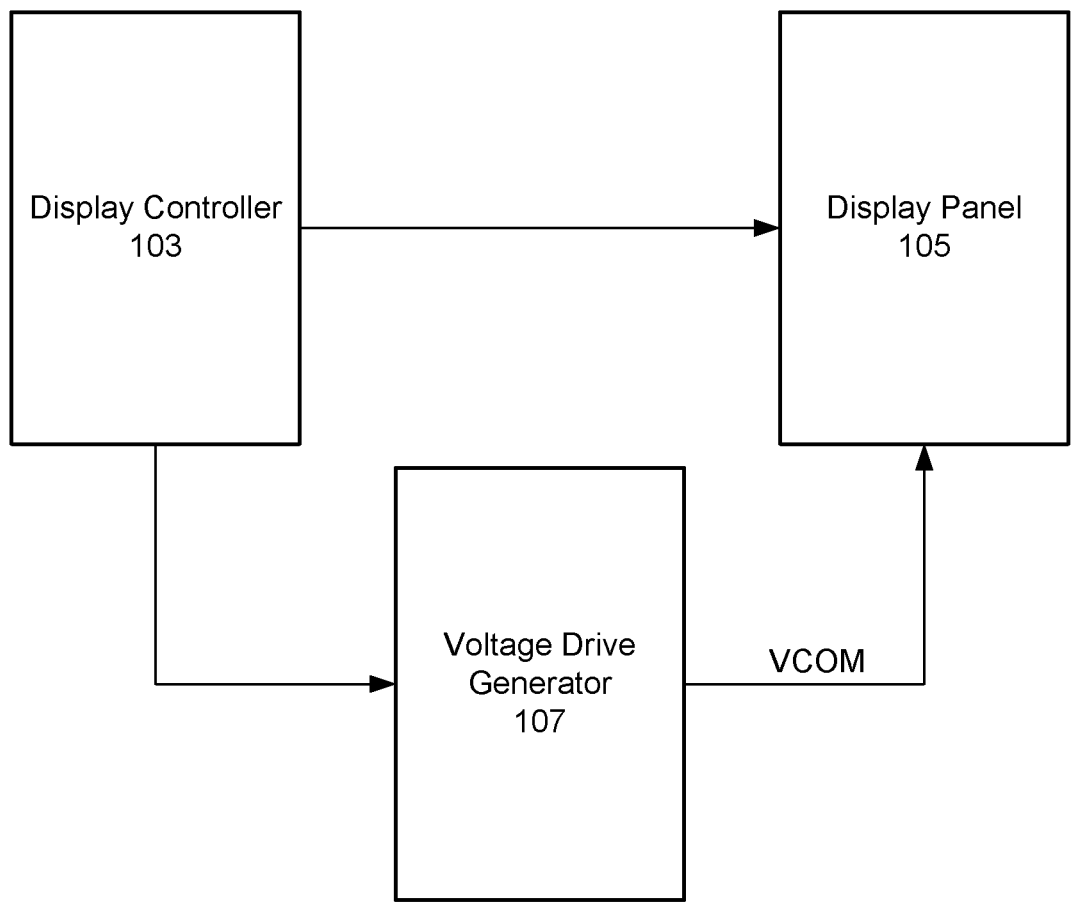
FIG. 1 shows a block diagram of a display system.

FIG. 1 shows a block diagram of a display system. This display system can be incorporated in computer monitors, televisions, instrument panels, aircraft cockpit displays, signage, laptop computers, video players, music players (e.g., Apple's iPod product family), gaming devices, cameras, clocks, watches, calculators, telephones, smartphones (e.g., Apple's iPhone product family, Google's Nexus product family, Samsung's Galaxy product family), tablets (e.g., Apple's iPad product family, Google's Nexus product family, or Samsung's Galaxy product family), and many other devices.

The display system includes a display controller 103 that drives a display panel 105 and a voltage drive generator 107, which also drives the display panel. The voltage drive generator can generate a reference voltage for the display panel.

Figure 2:
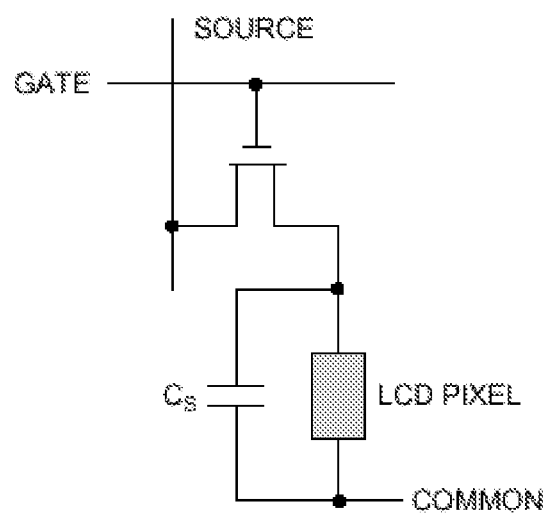
FIG. 2 shows a circuit diagram for a single LCD pixel.

The display system can be an LCD display system, such as for an active matrix thin-film transistor (TFT) display. FIG. 2 shows a circuit diagram for a single LCD pixel. Numerous pixels are arranged in an array to form a display panel. In an implementation, the voltage drive generator generates the VCOM reference voltage for pixels of the display panel.

Some common resolutions for panels includes 7680 by 4320 (e.g., 8K), 4096 by 2304 (e.g., 4K), 3840 by 2160 (e.g., 4K UHD), 2800 by 1800, 2560 by 1200, 2560 by 1400, 1600 by 1200, 1920 by 1080 (e.g., HD 1080), 1280 by 720 (e.g., 720p), 1136 by 640 (e.g., iPhone 5), 1280 by 768, 960 by 640 (e.g., iPhone 4S), 1024 by 768, 800 by 600, 800 by 480, 640 by 480, 480 by 320, and many more.

The TFT LCD is panel includes glass, a TFT array substrate, liquid crystal, a polarizer, color filters, and other components to implement a TFT LCD. The drive electronics of a TFT activate the TFT array substrate, resulting in an induced electromagnetic field that affects the liquid crystal. The liquid crystal is twisted in response to the induced electromagnetic field, allowing light to shine through the liquid crystal and the glass sandwich. The light intensity of the transmitted light is modulated by the color filters to output the desired color.

In other implementations, the display panel can be of another LCD technology, such as a passive-matrix LCD, super-twisted nematic (STN), double-layer STN (DSTN), or color-STN (CSTN). Or the display panel can use organic light emitted diode (OLED). Aspects of the invention can be applied to various display panel technologies.

A VCOM circuit outputs a VCOM reference voltage, which is typically used with or in an LCD screen. LCD screens have an array of pixels constantly lit by a backlight. The constancy of the light removes the type of flicker usually associated with cathode ray tube (CRT) screens (phosphors pulsing with each refresh cycle). Instead, an LCD pixel has upper and lower plates with grooves cut perpendicular to each other as in. These grooves align the liquid crystals to form channels for the backlight to pass through to the front of the panel. The amount of light emitted depends upon the orientation of the liquid crystals and is proportional to the applied voltage.

Referring to FIG. 2, the gate voltage acts as a switch signal and is commonly amplified to become −5 volts to 20 volts. The video source, typically ranging from 0 volts and 10 volts, provides the intensity information that appears across the pixel. The bottom of the pixel is commonly connected to the backplane of the panel. The voltage at this node is VCOM (the VCOM reference voltage).

While this set-up is functional, it reduces panel lifetime. Assuming the VCOM voltage is at ground, the voltage across the pixel varies from 0 volts to 10 volts. Assuming an average of 5 volts, there is substantial DC voltage across each pixel. This DC voltage causes charge storage, or memory. In the long term, it is a form of aging, degrading the pixels by electroplating ion impurities onto one of the electrodes of the pixel. This contributes to image retention, commonly known as a sticking image.

The construction of the LCD panel is generally symmetrical and either a positive or a negative voltage can be used to align the crystals. A technique is to adjust the common voltage (VCOM) to a midpoint of the video signal (e.g., 10/2, which is 5 volts) or other desired voltage level (e.g., $\frac{2}{3}$, $\frac{3}{4}$, or other percentage of the maximum signal voltage). Now the video signal swings above and below the common voltage (VCOM), creating a net zero effect on the pixel. This net zero effect on the liquid crystal eliminates the aging and image retention issues. A tradeoff for this technique is resolution, since the video signal travels 5 volts to full brightness instead of the entire 10-volt range.

The VCOM voltage should be set very precisely (e.g., around midpoint or $\frac{1}{2}$ of the AVDD power rail, $\frac{2}{3}$ of signal voltage, or other value) to avoid flicker. To illustrate why a panel will flicker, let's assume that due to manufacturing of the panel the VCOM is 5.5 volts. If the video signal swings between 0 volts and 10 volts, the full-scale voltage will be different on each field. On one field, the full-scale voltage will be 4.5 volts and on the other, the full-scale voltage will be 5.5 volts. This difference in full-scale voltage translates to a difference in intensity, experienced as flicker.

Due to the variations in construction of each panel, the optimal VCOM voltage can differ from panel to panel or across a single panel. It is important to be able to set the VCOM precisely and also be able to change it as needed to work optimally with a particular panel.

In the specific implementation shown, the display controller and voltage drive generator are circuits residing on separate integrated circuits or different semiconductor substrates. But in other implementation, some or all components of the voltage drive generator can be incorporated into the drive controller integrated circuit (or alternatively, integrated within the display panel).

Figure 3:
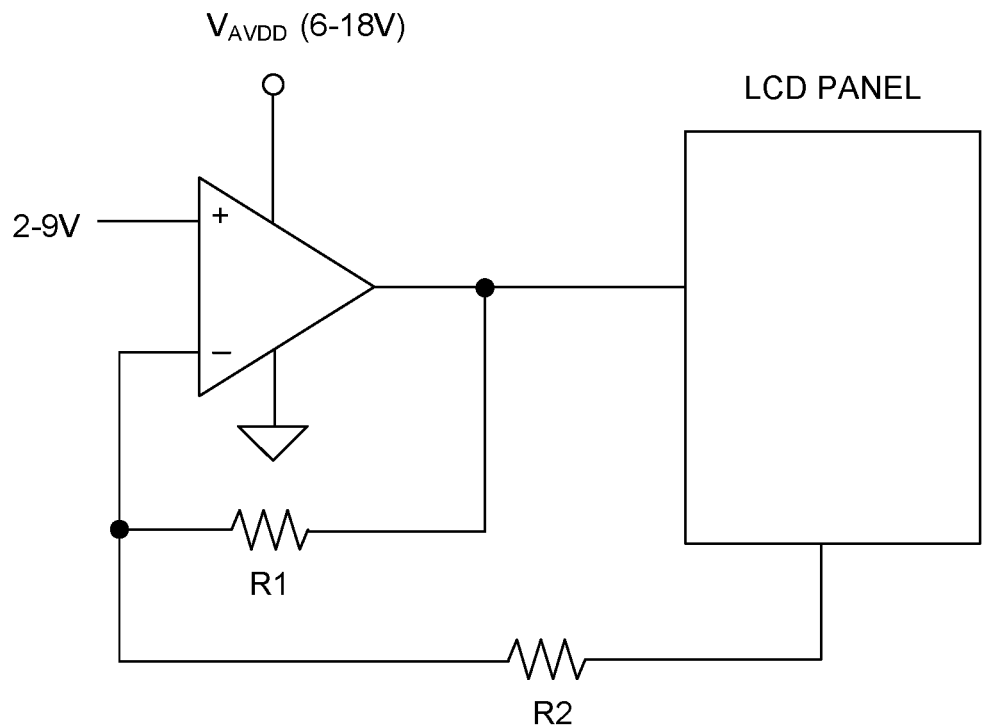
FIG. 3 shows a VCOM circuit connecting to an LCD panel.

FIG. 3 shows a VCOM circuit connecting to an LCD panel. The VCOM circuit has an operational amplifier with a plus input connected to a VCOM voltage-in (VIN) which level depends on a specific LCD panel but for example can range from about 2 volts to about 9 volts. An output of the operational amplifier is connected to the LCD panel. Feedback from this output is connected to the negative input via resistance or resistor R1. Feedback from the LCD panel is also connected to the negative input via resistance or resistor R2. In different circuit implementations, feedback resistors R1 and R2 can be replaced by simplified or more complex feedback networks. The operational amplifier's power is connected to supply rails AVDD and ground. The AVDD voltage also depends on a specific panel design and, for example, can range from about 6 volts to about 18 volts.

Figure 4:
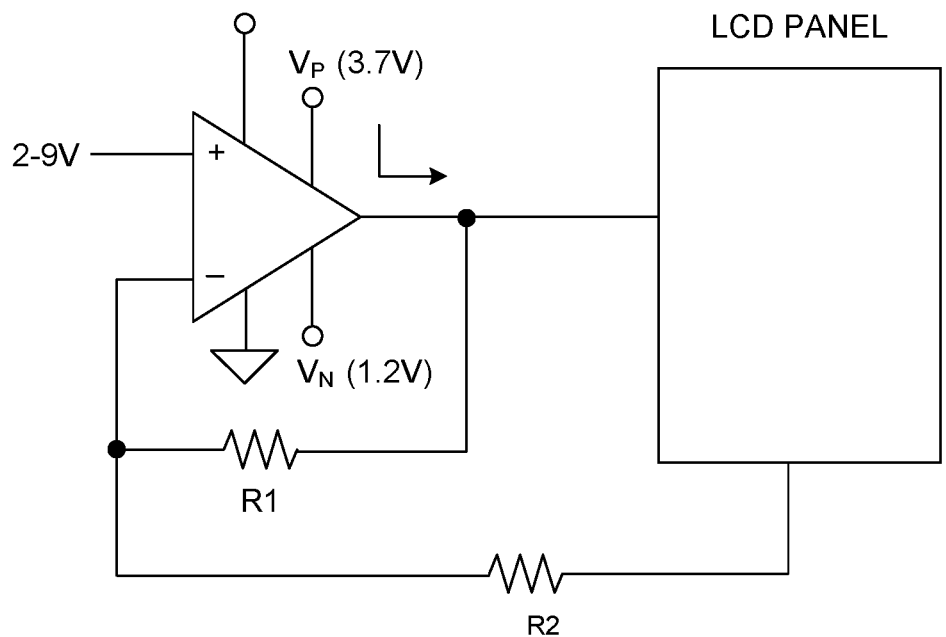
FIG. 4 shows a VCOM operational amplifier with four supply rails.

FIG. 4 shows a VCOM operational amplifier with four supply rails (AVDD, VP, VN, and GND). In addition to the amplifier from FIG. 3, this operational amplifier has additional VP and VN rails. As an example, VP can be about 3.7 volts and VN can be about 1.2 volts, but these specific levels can be varied depending on application.

Figure 5A:
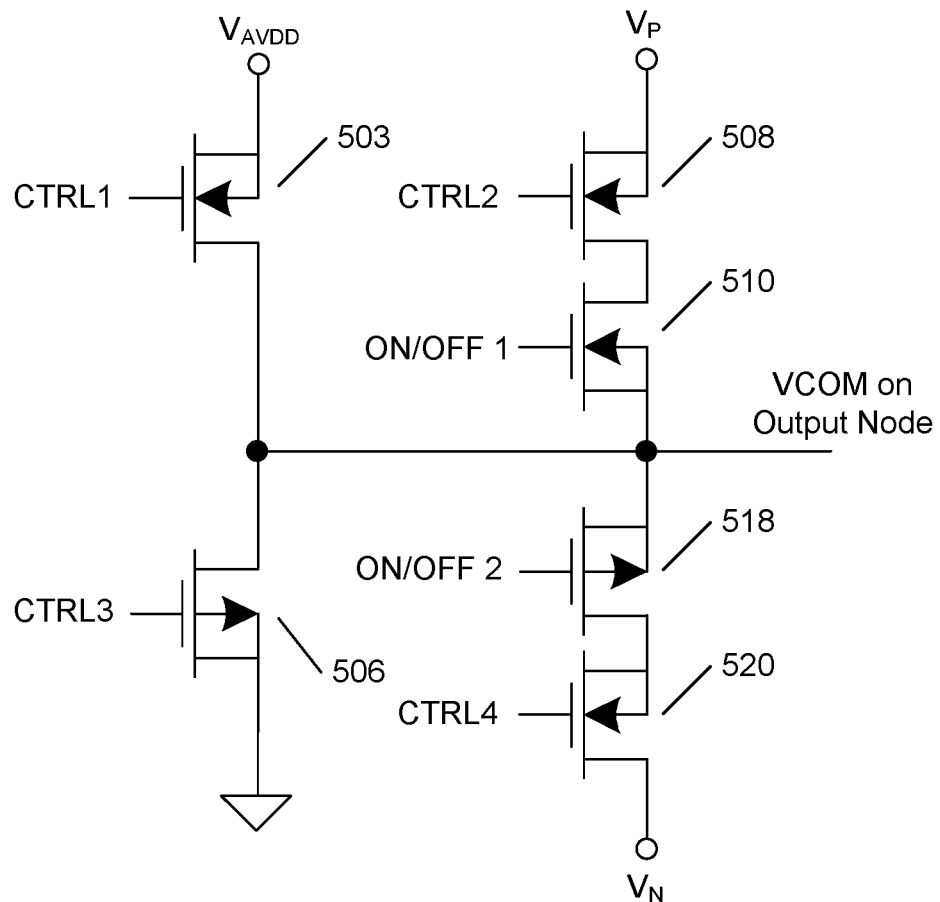
FIG. 5A shows a circuit implementation of an output stage of a VCOM operational amplifier having four supply rails.
Figure 5B:
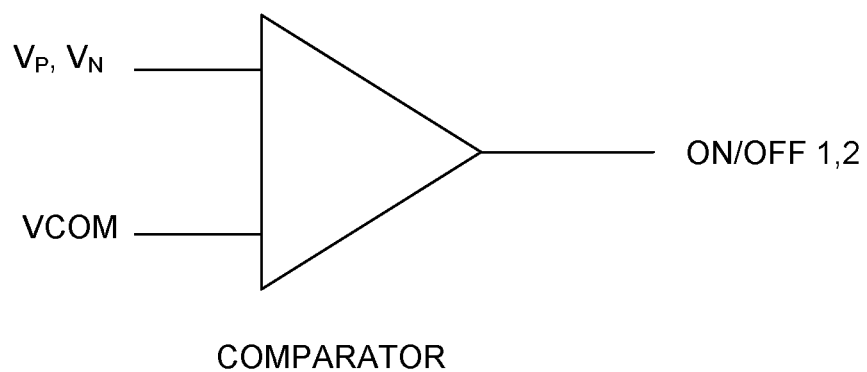
FIG. 5B shows a comparator circuit that generates a control signal for the output stage.

FIG. 5A shows another circuit implementation of an output stage of a VCOM operational amplifier having four supply rails. FIG. 5B shows a comparator circuit that generates a control signal for the output stage.

In the implementation of FIG. 5A, a PMOS transistor 503 is connected between the AVDD supply and the output node of the operational amplifier. A control electrode of transistor 503 is connected to a control signal CTRL1. An NMOS transistor 506 is connected between the output node and ground. A control electrode of transistor 506 is connected to a control signal CTRL3.

Two PMOS transistors 508 and 510 are connected between the VP supply and the output node. A control electrode of transistor 508 is connected to a control signal CTRL2. A control electrode of transistor is connected to a comparator output (ON/OFF 1) of a first comparator, such as shown in FIG. 5B. The first comparator receives and compares VP to VCOM to control transistor 510 for turning on or turning off this branch of the operational amplifier.

An NMOS transistor 518 and PMOS transistor 520 are connected between the output node and the VN supply. A control electrode of transistor 518 is connected to a comparator output (ON/OFF 2) of a second comparator, such as shown in FIG. 5B. The second comparator receives and compares VN to VCOM to control transistor 518 for turning on or turning off this branch of the operational amplifier. A control electrode of transistor 520 is connected to a control signal CTRL4.

The VCOM operational amplifier is described as including two comparator circuits for providing ON/OFF 1 and ON/OFF 2 signals. This comparator circuits can be separate circuits or can be combined as a single comparator circuit, having three inputs (e.g., VP, VN, and VCOM) and generating two outputs (e.g., ON/OFF 1 and ON/OFF 2).

Depending on the voltage level at VCOM, the first and second comparators of FIG. 5B turn on and off an output stage formed by transistors, 508, 510, 518, and 520, and an output stage formed by transistors 503 and 506. For example, in one implementation, when the voltage level at VCOM is between levels of VN and VP, the VP or VN supply, or both, are used to generate at the output node. This configuration provides that VP or VN, or both, supply or sink output current at the output node, reducing power dissipation compared to using AVDD and ground. This operational state is shown in the timing diagram of FIG. 7 as the time period t0.

When the voltage level at VCOM goes above VP, transistor 510 is turned off by the ON/OFF 1 signal. Then the operational amplifier (via transistor 503) uses VADD to supply the voltage to the output node. This operational state is shown in the timing diagram of FIG. 7 as the time period t1.

When the voltage level at VCOM goes below VN, transistor 518 is turned off by the ON/OFF2 signal. Then the operational amplifier (via transistor 506) use ground to supply the voltage to the output node. This operational state is shown in the timing diagram of FIG. 7 as the time period t2.

The circuits of this application can be implemented using any of a variety of integrated circuit fabrication processes that are suitable for the underlying device. Examples of such integrated circuit fabrication processes include, but are not limited to, BCD (bipolar, CMOS, DMOS) processes, digital CMOS processes, analog CMOS processes, MOSFETs (such as in FIG. 5A), bipolar (such as in FIG. 6), and mixed-signal CMOS processes.

BCD processes incorporate, into a single foundry process flow, what are typically three different process types: bipolar or BJT, which is used for analog control devices, CMOS (complementary metal oxide semiconductor) which forms devices that are suitable for the design of both digital and analog circuits, and DMOS (double-diffused MOS) which is used to form devices that are appropriate for high current output. Similarly, the related BiCMOS foundry process integrates manufacturing technology for forming bipolar devices and CMOS devices on a single die, and can also be used. Numerous other commercial and specialized processes exist that can be used to fabricate one or more of the die. Examples include CMOS variations such as high voltage CMOS, RF CMOS, SiGe, BiCMOS, radiation hardened processes, GaAs specific processes, and the like.

Thus, although the circuit example in FIG. 5A uses MOSFET technology (e.g., CMOS, NMOS, or PMOS), this circuit can generally be implemented in any of a number of integrated circuit processes. Further, this application provides some specific examples of circuit arrangements, but this patent also covers their circuit equivalents, such as by the principle of duality. For example, a PMOS transistor circuit configuration may be substituted with an equivalent NMOS transistor circuit configuration, and vice versa.

Figure 6:
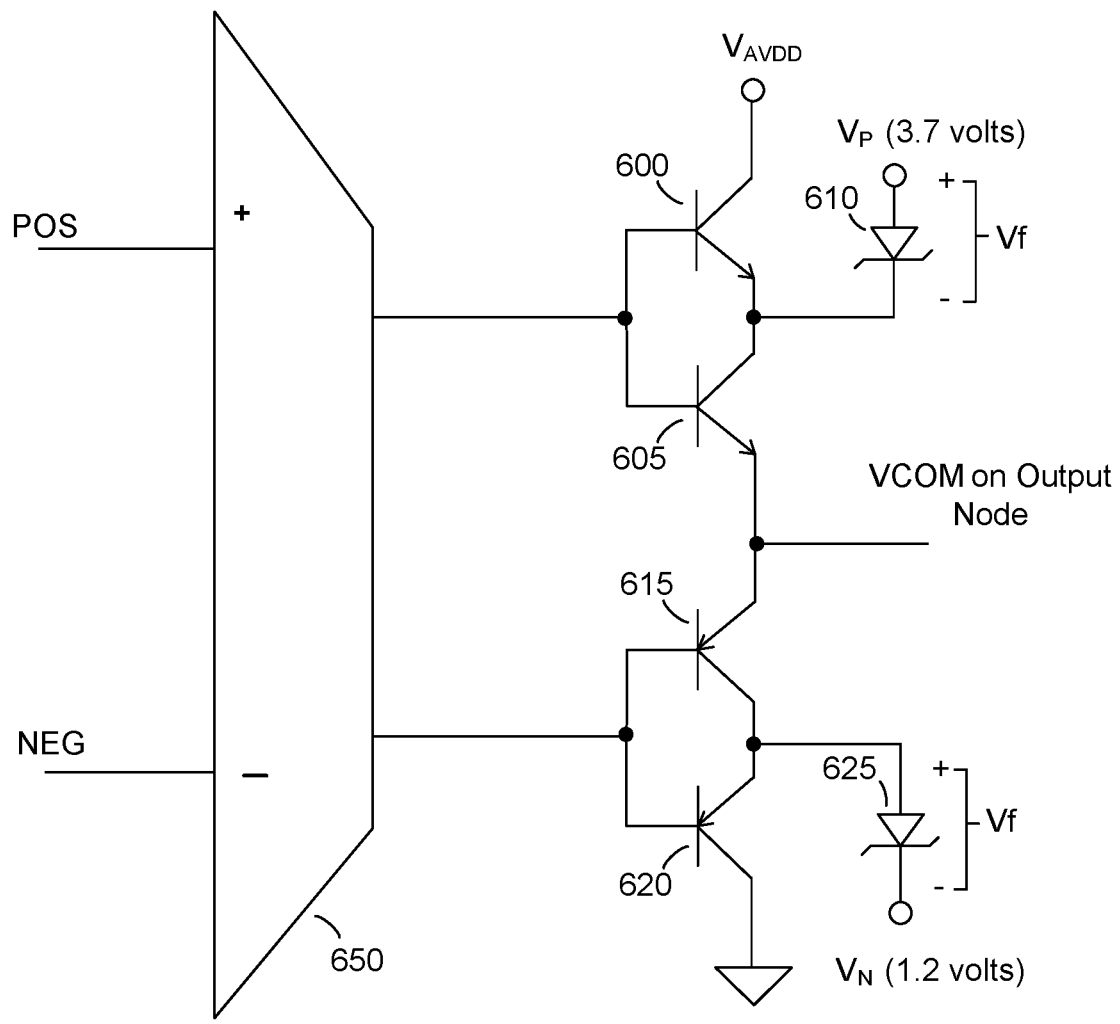
FIG. 6 shows another circuit implementation of an output stage of a VCOM operational amplifier having four supply rails.

FIG. 6 shows another circuit implementation of an output stage of a VCOM operational amplifier having four supply rails AVDD, VP, VN, and GND. This implementation uses bipolar transistors. This output stage may be referred to as a class G output stage.

Two n-channel (NPN) bipolar junction transistors (BJTs) 600 and 605 are connected between AVDD and the output node of the operational amplifier. A diode 610 (e.g., a Schottky diode) is connected between VP (e.g., 3.7 volts) and a common node of BJTs 600 and 605 to set the common node to a bias voltage. The control electrodes of BJTs 600 and 605 are connected to a first output a predriver circuit 650, such as an operational amplifier or op amp that can supply control signals to the BJTs, based on its positive (POS or +) and negative (NEG or −) inputs.

Two p-channel (PNP) BJTs 615 and 620 are connected between the output node of the operational amplifier and ground. A diode 625 (e.g., a Schottky diode) is connected between VN (e.g., 1.2 volts) and a common node of BJTs 615 and 620 to set this node to a bias voltage. The control electrodes of BJTs 615 and 620 are connected to a second output of predriver circuit 650 that can supply control signals to the BJTs.

In an implementation, diodes 610 and 625 are Schottky diodes. In other implementations, diode 610 or 625, or both, can be substituted with other types of diodes other than Schottky diodes, such as a standard diode, transistor diodes, silicon-controlled rectifier diode, zener diode, junction diode, tunnel diode, avalanche diode, or others. For example, a Schottky diode can have a forward voltage of about 0.15-0.45 volts. In comparison, a normal silicon diode typically has a voltage drop between about 0.6-0.7 volts.

In a specific implementation, transistor 600 is connected between AVDD and a first node. Transistor 605 is connected between the first node and a VCOM or output node. Control electrodes of transistors 600 or 605 are connected to a first output of predriver 650. Diode 610 is connected between VP and the first node Transistor 615 is connected between the output node and a second node. Transistor 620 is connected between the second node and ground. Control electrodes of transistors 615 or 620 are connected to a second output of predriver 650. Diode 625 is connected between VN and the second node.

Generally, the VCOM generator circuit of FIG. 6 operates similarly to the circuitry in FIGS. 5A and 5B for supplying an output (e.g., voltage or current, or both) at the output node.

Figure 7:
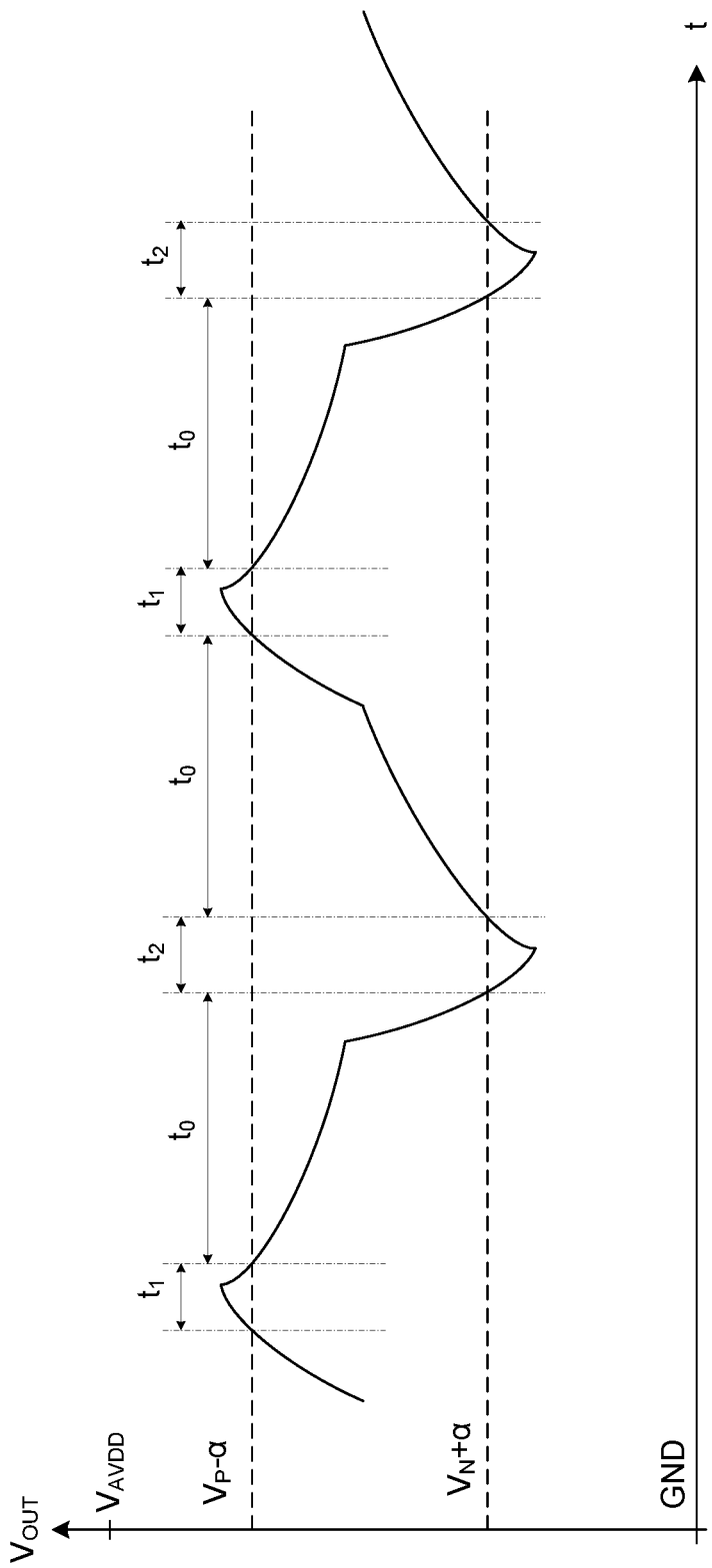
FIG. 7 shows a timing diagram on the operation of a VCOM operational amplifier with four supply rails.

FIG. 7 shows a timing diagram of the operation of the implementation of both of the VCOM operational amplifier of FIGS. 5A and 6. A table A below summarizes the operation of the circuitry in FIG. 6. Specifically, the table gives the states of the transistors under various operating conditions. OFF in the table means Vbe is less than the cut-in voltage (around 0.6 volts at room temperature), and Ice=0.

TABLE A

| | POS > NEG (Input to Op Amp 650) | VCOM ≤ VN + VF | VN + VF < VCOM < VP-VF | VP-VF ≤ VCOM |
|---|---|---|---|---|
| BJT 600 (NPN1) | Yes | Off | Off | On |
| BJT 605 (NPN2) | | On | On | On |
| BJT 615 (PNP2) | | Off | Off | Off |
| BJT 620 (PNP1) | | Off | Off | Off |
| BJT 600 (NPN1) | No | Off | Off | Off |
| BJT 605 (NPN2) | | Off | Off | Off |
| BJT 615 (PNP2) | | On | On | On |
| BJT 620 (PNP1) | | On | Off | Off |

More specifically, when POS is greater than NEG, and when the voltage level at VCOM goes above about VP, BJT 600 will be ON, BJT 605 will be ON, BJT 615 will be OFF, and BJT 620 will be OFF. Under these conditions, AVDD is used to generate the voltage at the output node, while VP will not be connected. This operational state is shown in FIG. 7 as the time period t1.

When POS is greater than NEG, and when the voltage level at VCOM is between about VP and about VN, BJT 600 will be OFF, BJT 605 will be ON, BJT 615 will be OFF, and BJT 620 will be OFF. Under these conditions, VP is used to generate the voltage at the output node, while AVDD will not be connected. This operational state is shown in FIG. 7 as the time period to When POS is greater than NEG, and when the voltage level at VCOM goes below about VN, BJT 600 will be ON, BJT 605 will be ON, BJT 615 will be OFF, and BJT 620 will be OFF. Under these conditions, VP is used to generate the voltage at the output node, while AVDD will not be connected. This operational state is shown in the timing diagram of FIG. 7 as the time period t2.

When POS is less than NEG, and when the voltage level at VCOM goes above about VP, BJT 600 will be OFF, BJT 605 will be OFF, BJT 615 will be ON, and BJT 620 will be OFF. Under these conditions, VN is used to generate the voltage at the output node, while ground will not be connected. This operational state is shown in FIG. 7 as the time period t1.

When POS is less than NEG, and when the voltage level at VCOM is between about VP and about VN, BJT 600 will be OFF, BJT 605 will be OFF, BJT 615 will be ON, and BJT 620 will be OFF. Under these conditions, VN is used to generate the voltage at the output node, while ground will not be connected. This operational state is shown in FIG. 7 as the time period to.

When POS is less than NEG, and when the voltage level at VCOM goes below about VN, BJT 600 will be OFF, BJT 605 will be OFF, BJT 615 will be ON, and BJT 620 will be ON. Under these conditions, VPN is used to generate the voltage at the output node, while ground will not be connected. This operational state is shown in the timing diagram of FIG. 7 as the time period t2.

While in dynamic transient, POS could be bigger or smaller than NEG. And Vout could swing between 0 and AVDD. The value will depend on feedback network and load. When Vn+Vf<Vout<Vp−Vf, no current will go through AVDD or GND, instead current goes through VP (lower than AVDD) or VN (higher than 0), or both. Thus, power is saved because power does not go through AVDD or ground.

Figure 8A:
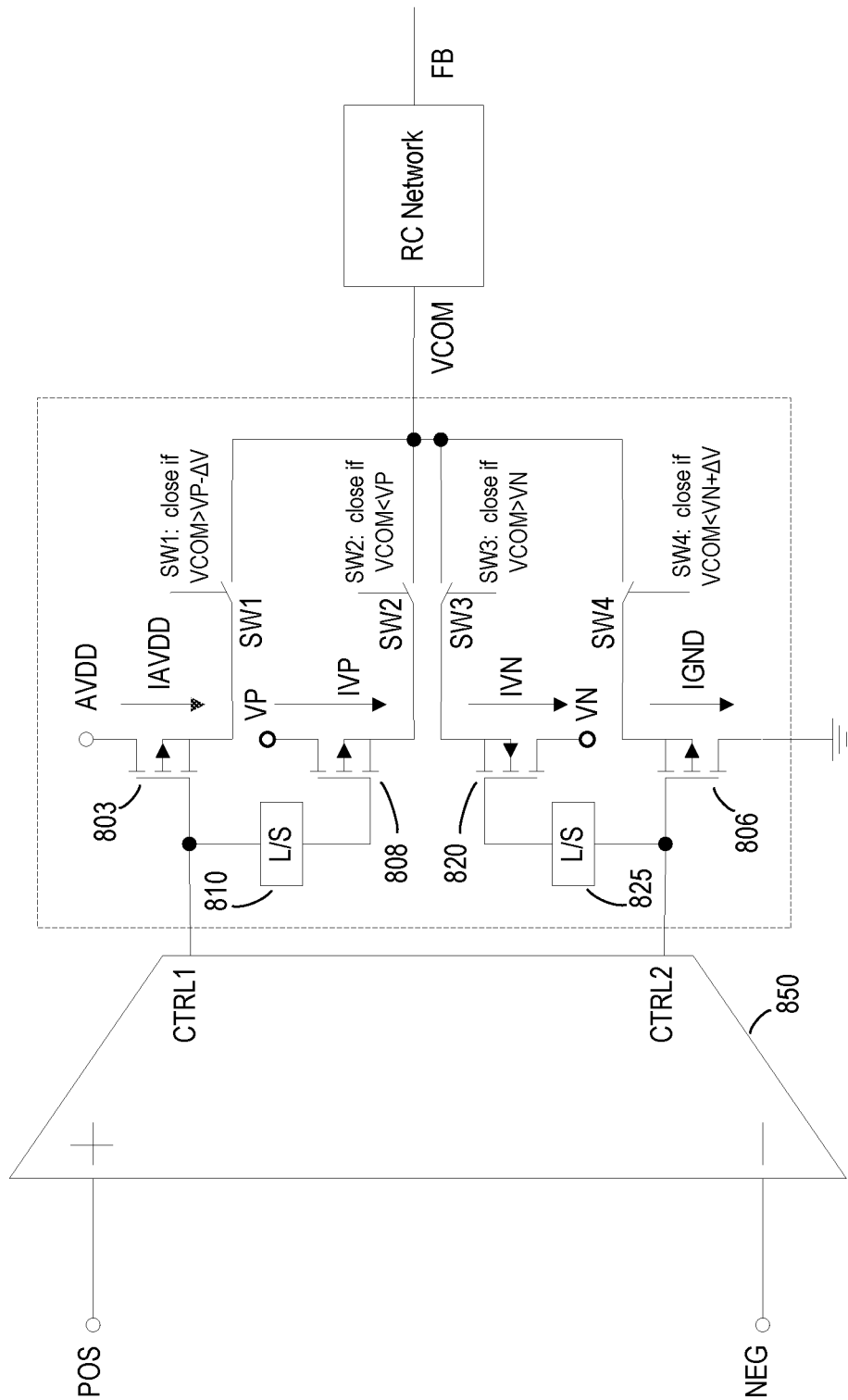
FIG. 8A shows another implementation of a VCOM circuit.
Figure 8B:
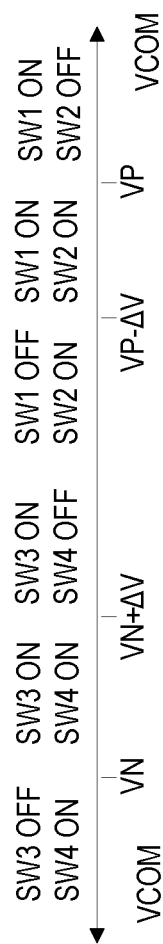
FIG. 8B shows a state of the switches of the FIG. 8A circuit at different VCOM voltages.

FIG. 8A shows another implementation of a VCOM circuit. FIG. 8B shows a state of the switches of the FIG. 8A circuit at different VCOM voltages. In FIG. 8B, ON refers to a closed switch and OFF refers to an open switch.

In FIG. 8A, this implementation of a VCOM generator circuit has four supply rails AVDD, VP, VN, and ground. VP is less than AVDD. VN is greater than GND.

An NMOS transistor 803 and a switch SW1 are connected between the AVDD supply and an output node of the circuit. In the specific implementation, switch SW1 is positioned between transistor 803 and the output node. Switch SW1 may be opened and closed to connect and disconnect transistor 803 from the output node based on this switch's control input. In an implementation, SW1 is closed when VCOM is greater than VP minus delta V.

An NMOS transistor 808 and a switch SW2 are connected between the VP supply and the output node. In the specific implementation, switch SW2 is positioned between transistor 808 and the output node. Switch SW2 may be opened and closed to connect and disconnect transistor 808 from the output node based on this switch's control input. In an implementation, SW2 is closed when VCOM is less than VP.

Control electrodes of transistors 803 and 808 are connected to a common control line for receiving a common control signal CTRL1. The CTRL1 signal is generated by a predriver 850, such as an operational amplifier or op amp, based on positive (POS or +) and negative (NEG or −) inputs to predriver 850. In a specific implementation the POS or NEG input, or both, are connected by feedback (FB) to the output node (e.g., see FIG. 4), feedback from the RC network (e.g., display). The control electrode of transistor 808 may be connected to CTRL1 through a level shifter 810, which adjusts the voltage from CTRL1 to an appropriate level for transistor 808. The level shifter may be substantially continuously active due to the difference in potential between AVDD and VP. Therefore, the level shifter provides for the potentials at the control electrodes can be shifted accordingly.

A PMOS transistor 820 and a switch SW3 are connected between the VN supply and the output node of the operational amplifier. In the specific implementation, switch SW3 is positioned between transistor 820 and the output node. Switch SW3 may be opened and closed to connect and disconnect transistor 820 from the output node based on this switch's control input. In an implementation, SW3 is closed when VCOM is greater than VN.

An NMOS transistor 806 and a switch SW4 are connected between the GND and the output node of the operational amplifier. In the specific implementation, switch SW4 is positioned between transistor 806 and the output node. Switch SW4 may be opened and closed to connect and disconnect transistor 806 from the output node based on this switch's control input. In an implementation, SW4 is closed when VCOM is less than VN plus delta V.

Control electrodes of transistors 806 and 820 are connected to a common control line for receiving a common control signal CTRL2. The CTRL2 signal is generated by a comparator or predriver 850 based on positive (POS or +) and negative (NEG or −) inputs to predriver 850. The control electrode of transistor 820 may be connected to CTRL2 through a level shifter 825, which adjusts the voltage from CTRL2 to an appropriate level for transistor 825. The level shifter may be substantially continuously active due to the difference in potential between AVDD and VP. Therefore, the level shifter provides for the potentials at the control electrodes can be shifted accordingly.

In an implementation, switches SW1, SW2, SW3, and SW4 are independently controllable for providing voltage or current, or both, to the output node from AVDD, VP, VN, or GND supplies. The states of the switches are summarized in table B.

TABLE B

|  | VCOM < VN | VN < VCOM < VN + ΔV | VN + ΔV < VCOM < VP-ΔV | VP- ΔV < VCOM < VP | VCOM > VP |
|---|---|---|---|---|---|
| SW1 | Open | Open | Open | Closed | Closed |
| SW2 | Closed | Closed | Closed | Closed | Open |
| SW3 | Open | Closed | Closed | Closed | Closed |
| SW4 | Closed | Closed | Open | Open | Open |

Figure 9:
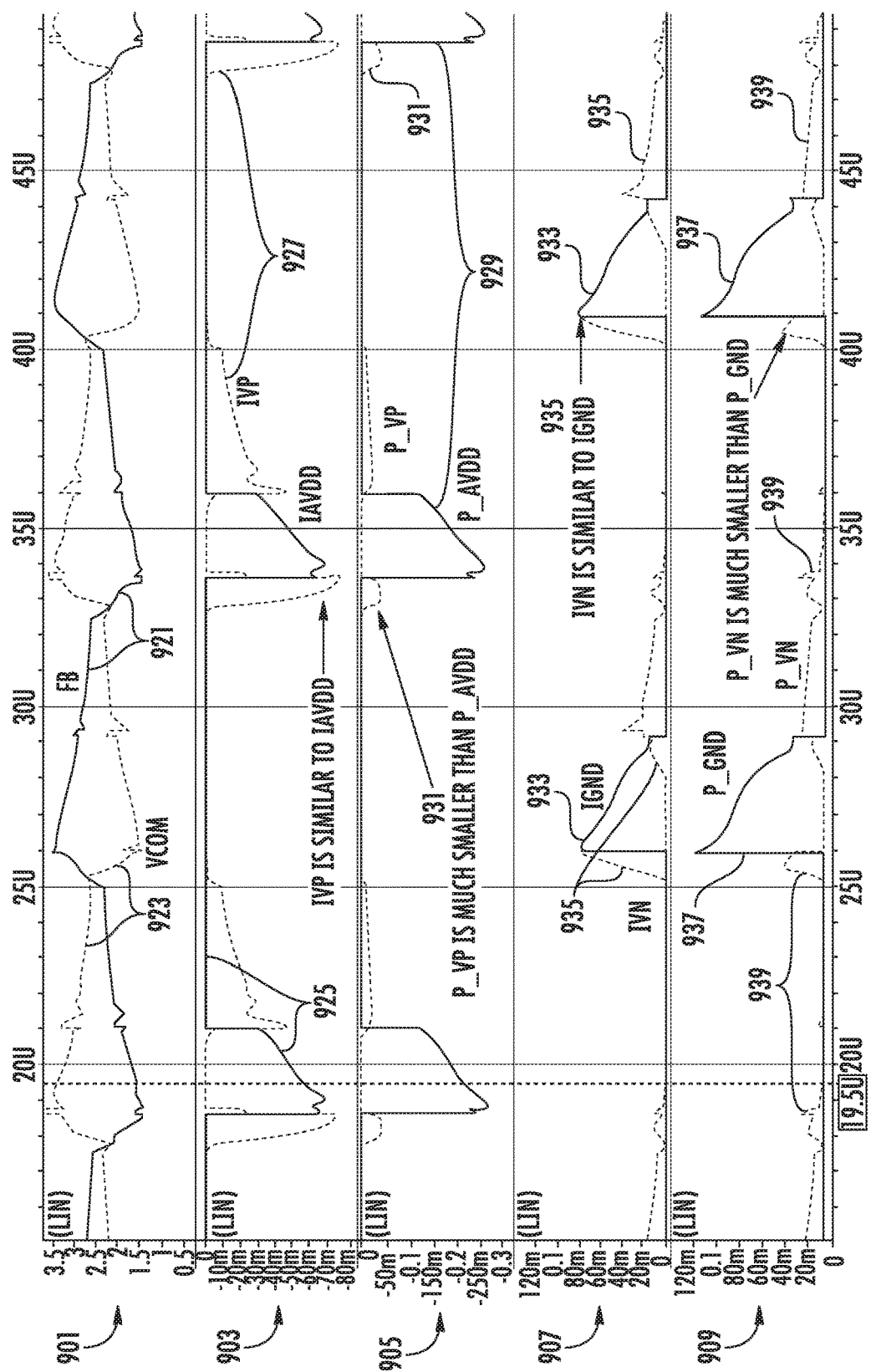
FIG. 9 shows a timing diagram for the VCOM circuit implementation in FIG. 8A.

FIG. 9 shows a timing diagram for the implementation of the VCOM operational amplifier of FIG. 8. In the specific implementation of FIG. 9 AVDD is 7.5 volts, VP is 3.7 volts, VN is 1.2 volts, and POS (control gate voltage) is 2.4 volts. FIG. 9 shows that for a constant current supplied to an RC network (e.g., LCD pixels of display panel 105) with RC loading, the power (P=I*V) supplied to the RC network is reduced when VCOM (e.g., based on the feedback FB from the output node, the FB from the display, or both) is reduced. VCOM can be reduced by current supplied by AVDD and VN or VP and GND. FIG. 9 further shows that when the current supplied to the RC network is reduced (e.g., reduced IVP, which is the current from VP, and reduced IVN, which is the current from VN) that power supplied from the VCOM operational amplifier is reduced further.

These current reductions provide for lowered ion accumulation on the electrodes across the LCD pixels and reduce the memory (e.g., image retention) of the LCD pixels by reducing the residual alignment of the liquid crystals due to ion accumulation. Lowering power consumptions also allows the LDC pixels and LCD display to operate more efficiently by generating less heat waste.

According to an implementation, in FIG. 9, a graph 901 shows feedback (FB) in plot 921. In some implementations, feedback is provided to the operational amplifier from the output node, the display panel, or both. Graph 901 also shows VCOM in data plot 923.

A graph 903 shows a plot 925 for current IAVDD from AVDD that is shown in graph 901. Graph 903 shows a plot 927 for current IVP from VP that is shown in graph 901. Graph 905 shows a plot 929 for power consumption P_AVDD for current IAVDD and voltage AVDD. A graph 905 also shows a plot 931 the power consumption P_VP for current IVP and voltage VP.

A graph 907 shows a plot 933 for current IGND from GND. Graph 907 also shows a plot 935 for current IVN from VN. A graph 909 shows a plot 937 for power consumption P_GND for current IGND and ground. Graph 909 also shows plot 939 for power consumption P_VN for current IVN and voltage VN. The reduced power consumptions for P_VP and P_VN shown in graphs 905 and 909 results from the reduced VCOM provided for by the four rails connected to the VCOM operational amplifier and the VCOM operational amplifiers use of the rails as described.

In some implementations, the VCOM generation circuit includes three rails, rather than four rails. As examples, an implementation includes supplies AVDD, ground, and VP. Another implementation includes AVDD, ground, and VN. The circuitry in the examples given in this application can be modified to include three supplies, rather than four.

With respect to the FIG. 5A circuitry, for an implementation with supplies AVDD, ground, and VP, the circuitry would include transistors 503, 506, 508, and 510. Transistor 518 and 520 would be omitted. For an implementation with supplies AVDD, ground, and VN, the circuitry would include transistors 503, 506, 518, and 520. Transistor 508 and 510 would be omitted.

With respect to the FIG. 6 circuitry, for an implementation with supplies AVDD, ground, and VP, the circuitry would include transistors 600, 605, 615, and 620, and device 610. Device 625 would be omitted. For an implementation with supplies AVDD, ground, and VN, the circuitry would include transistors 600, 605, 615, and 620, and device 620. Device 610 would be omitted.

With respect to the FIG. 8A circuitry, for an implementation with supplies AVDD, ground, and VP, the circuitry would include transistors 803, 808, and 806 (and associated switches). Transistor 820 (and associated switch) would be omitted. For an implementation with supplies AVDD, ground, and VN, the circuitry would include transistors 803, 806, and 820 (and associated switches). Transistor 808 (and associated switch) would be omitted.

Although some specific values have been given for VP and VN above, one having ordinary skill recognizes these voltages can vary. Generally, VP can be any intermediate voltage between AVDD and ground. And VN can be any intermediate voltage between AVDD and ground. In an implementation with both VP and VN supplies, then VP can be any intermediate voltage between AVDD and VN. And VN can be any intermediate voltage between VP and ground.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A method comprising:
providing a voltage generator circuit comprising a reference voltage output node for coupling to a common voltage signal input of a display panel;
coupling the reference voltage output node of the voltage generator circuit between an AVDD supply and a ground supply;
coupling a V2 supply to the reference voltage output node, wherein the V2 supply is at a fixed voltage level between the AVDD and ground supplies;
when a voltage level at the reference voltage output node is below the V2 voltage level, supplying current from the ground supply to the reference voltage output node; and
when a voltage level at the reference voltage output node is above the V2 voltage level, supplying current from the V2 supply to the reference voltage output node, and not supplying output current from the AVDD supply to the reference voltage output node.

2. The method of claim 1 comprising:
coupling a V1 supply to the reference voltage output node, wherein the V1 supply is at a fixed voltage level between the AVDD and ground supplies, and a V1 voltage level of the V1 supply is above the V2 voltage level; and
when a voltage level at the reference voltage output node is above a V1 voltage level of the V1 supply, supplying output current from the AVDD supply to the reference voltage output node.

3. The method of claim 2 wherein an AVDD voltage level of the AVDD supply is above the V1 voltage level, which is above the V2 voltage level, which is above ground.

4. The method of claim 2 wherein during operation, the reference voltage output node is at a voltage level above the V1 voltage level and below an AVDD voltage level of the AVDD supply.

5. The method of claim 2 wherein during a first time period of operation, the reference voltage output node is at a voltage above the V1 voltage level and below an AVDD voltage level of the AVDD supply, and
during a second time period of operation, the reference voltage output node is at a voltage below the V2 voltage level and above ground.

6. The method of claim 2 wherein during a first time period of operation, the reference voltage output node is at a voltage above the V1 voltage level and below an AVDD voltage level of the AVDD supply,
during a second time period of operation, the reference voltage output node is at a voltage below the V2 voltage level and above ground, and
during a third time period of operation, the reference voltage output node is at a voltage between the V1 and V2 voltage levels.

7. The method of claim 6 wherein the third time period of operation is between the first and second time periods of operation.

8. The method of claim 2 comprising:
providing a first transistor comprising a control electrode coupled to a first control signal, a first electrode coupled to the V1 supply, and a second electrode coupled to a first node;
providing a second transistor comprising a control electrode coupled to a second control signal, a first electrode coupled to the first node, and a second electrode coupled to the reference voltage output node;
providing a third transistor comprising a control electrode coupled to a third control signal, a first electrode coupled to the V2 supply, and a second electrode coupled to a second node; and
providing a fourth transistor comprising a control electrode coupled to a fourth control signal, a first electrode coupled to the second node, and a second electrode coupled to the reference voltage output node.

9. The method of claim 8 comprising:
providing a fifth transistor coupled between the AVDD supply and the reference voltage output node; and
providing a sixth transistor coupled between the reference voltage output node and the ground supply.

10. The method of claim 2 comprising:
providing a first transistor comprising a control electrode coupled to a first control signal, a first electrode coupled to the V1 supply, and a second electrode coupled to a first node; and
providing a second transistor comprising a control electrode coupled to a second control signal, a first electrode coupled to the first node, and a second electrode coupled to the reference voltage output node.

11. The method of claim 2 comprising:
providing a first transistor comprising a control electrode coupled to a first signal, a first electrode coupled to the AVDD supply, and a second electrode coupled to a first node;
providing a second transistor comprising a control electrode coupled to the first signal, a first electrode coupled to the first node, and a second electrode coupled to the reference voltage output node; and
providing a diode coupled between the V1 supply and the first node.

12. The method of claim 2 comprising:
providing a first transistor comprising a control electrode coupled to a first signal, a first electrode coupled to the AVDD supply, and a second electrode coupled to a first node;
providing a second transistor comprising a control electrode coupled to the first signal, a first electrode coupled to the first node, and a second electrode coupled to the reference voltage output node;
providing a diode coupled between the V1 supply and the first node;
providing a third transistor comprising a control electrode coupled to a second signal, a first electrode coupled to the ground supply, and a second electrode coupled to a second node;
providing a fourth transistor comprising a control electrode coupled to the second signal, a first electrode coupled to the second node, and a second electrode coupled to the reference voltage output node; and
providing a diode coupled between the V2 supply and the second node.

13. The method of claim 1 wherein during normal operation, the reference voltage output node is at a voltage that cannot exceed an AVDD voltage level.

14. The method of claim 1 wherein during a normal operation, the reference voltage output node is at a voltage that cannot be below ground.

15. The method of claim 1 wherein during operation, the reference voltage output node is at a voltage below the V2 voltage level and above ground.

16. A method comprising:
providing a voltage generator circuit comprising a reference voltage output node for coupling to a common voltage signal input of a display panel;
coupling the reference voltage output node of the voltage generator circuit between an AVDD supply and a ground supply;
coupling a V1 supply to the reference voltage output node, wherein the V1 supply is at a fixed voltage level between the AVDD and ground supplies;
when a voltage level at the reference voltage output node is above a V1 voltage level of the V1 supply, supplying output current from the AVDD supply to the reference voltage output node;
when a voltage level at the reference voltage output node is below the V1 voltage level, supplying output current from the V1 supply to the reference voltage output node, and not supplying output current from the AVDD supply to the reference voltage output node;
coupling a V2 supply to the reference voltage output node, wherein the V2 supply is at a fixed voltage level between the AVDD and ground supplies, and a V2 voltage level of the V2 supply is below the V1 voltage level;
when a voltage level at the reference voltage output node is below the V2 voltage level, supplying current from the ground supply to the reference voltage output node; and
when a voltage level at the reference voltage output node is above the V2 voltage level and below the V1 voltage level, supplying current from the V1 supply to the reference voltage output node, and not supplying output current from the AVDD supply to the reference voltage output node.

17. The method of claim 16 wherein an AVDD voltage level of the AVDD supply is above the V1 voltage level, which is above ground.

18. The method of claim 16 wherein during operation, the reference voltage output node is at a voltage level above the V1 voltage level and below the AVDD voltage level.

19. The method of claim 16 wherein during a first time period of operation, the reference voltage output node is at a voltage level above the V1 voltage level and below AVDD voltage level, and
during a second time period of operation, the reference voltage output node is at a voltage between the V1 voltage level and ground.

20. A method comprising:
providing a voltage generator circuit comprising a reference voltage output node for coupling to a common voltage signal input of a display panel;
coupling the reference voltage output node of the voltage generator circuit between an AVDD supply and a ground supply;
coupling a V1 supply to the reference voltage output node, wherein the V1 supply is at a fixed voltage level between the AVDD and ground supplies;
when a voltage level at the reference voltage output node is above a V1 voltage level of the V1 supply, supplying output current from the AVDD supply to the reference voltage output node;
when a voltage level at the reference voltage output node is below the V1 voltage level, supplying output current from the V1 supply to the reference voltage output node, and not supplying output current from the AVDD supply to the reference voltage output node;
coupling a V2 supply to the reference voltage output node, wherein the V2 supply is at a fixed voltage level between the AVDD and ground supplies, and a V2 voltage level of the V2 supply is below the V1 voltage level;
when a voltage level at the reference voltage output node is below the V2 voltage level, supplying current from the ground supply to the reference voltage output node; and
when a voltage level at the reference voltage output node is above the V2 voltage level and below the V1 voltage level, supplying current from the V2 supply to the reference voltage output node, and not supplying output current from the AVDD supply to the reference voltage output node.

21. The method of claim 20 wherein during a first time period of operation, the reference voltage output node is at a voltage level above the V1 voltage level and below AVDD voltage level, and
during a second time period of operation, the reference voltage output node is at a voltage between the V1 voltage level and ground.

* * * * *